(12) United States Patent
Lee

(10) Patent No.: US 7,613,057 B2
(45) Date of Patent: Nov. 3, 2009

(54) CIRCUIT AND METHOD FOR A SENSE AMPLIFIER

(75) Inventor: Cheng Hung Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 164 days.

(21) Appl. No.: 11/732,297

(22) Filed: Apr. 3, 2007

(65) Prior Publication Data
US 2008/0247249 A1 Oct. 9, 2008

(51) Int. Cl.
*G11C 7/00* (2006.01)
(52) U.S. Cl. .................. 365/205; 365/203; 365/207; 327/50; 327/51
(58) Field of Classification Search .......... 365/205, 365/207, 203; 327/50, 51
See application file for complete search history.

(56) References Cited
U.S. PATENT DOCUMENTS 7,019,999 B1 * 3/2006 Srinivasan et al. ........ 365/49.1
7,057,957 B2 6/2006 Wang
7,071,737 B2 * 7/2006 Kawasumi et al. .......... 327/51
7,304,910 B1 * 12/2007 Hanzawa et al. ....... 365/233.18

* cited by examiner

*Primary Examiner*—Pho M Luu
*Assistant Examiner*—Toan Le
(74) *Attorney, Agent, or Firm*—Slater & Matsil, L.L.P.

(57) ABSTRACT

A circuit and method for providing a sense amplifier for a DRAM memory with reduced distortion in a control signal, the sense amplifier particularly useful for embedding DRAM memory with other logic and memory functions in an integrated circuit. A sense enable circuit is provided for a differential sensing latch in a sense amplifier having a cascade coupled pair of transistors, each transistor receiving a separate control signal. The separate control signals are provided by a control circuit with a delayed overlap. Differential sensing is enabled when the delayed overlap exists between the separate control signals. An array of DRAM memory cells are coupled to a plurality of the sense amplifiers. The DRAM memory incorporating the sense amplifiers may be embedded with other circuitry in an integrated circuit. Methods for providing the control signals and for laying out the DRAM memory with the sense amplifiers are provided.

20 Claims, 13 Drawing Sheets

FIG. 9 (TYPICAL ART)

CIRCUIT AND METHOD FOR A SENSE AMPLIFIER

TECHNICAL FIELD

The present invention relates to a circuit and method for providing a sense amplifier for use in a dynamic RAM ("DRAM") memory with enhanced performance. This sense amplifier is particularly useful when the DRAM is implemented as an embedded DRAM in an integrated circuit including other functions such as user specified logic, processor, interface functions, other memory types, and the like. The sense amplifier enable circuitry is configured to enable proper operation even for large arrays of DRAM with particularly wide data words, where control lines carrying control signals are quite long and the control signals are subjected to heavy loading. The circuit of the sense amplifier is configured to have improved performance while remaining just as compact as the sense amplifiers of the prior art.

BACKGROUND

Highly integrated semiconductor circuits are increasingly important, particularly in the field of producing battery operated devices such as cell phones, portable computers such as laptops, notebook and PDAs, wireless email terminals, MP3 audio and video players, portable wireless webbrowsers and the like, and these integrated circuits increasingly include on-board data storage. As is known in the art, such storage may take the form of dynamic memory in which arrays of cells are provided, each cell is a storage capacitor formed with an adjacent access transistor. Dynamic memory of DRAM offers excellent density and required minimum silicon area, and is often provided as fast access memory for a processor, such as a first level cache memory or scratchpad memory. In the prior art it is known to produce these DRAMs as stand alone integrated circuits using dedicated semiconductor process techniques that are specifically optimized to produce space and power efficient DRAM devices.

As semiconductor process technology advances have occurred, recently the fabrication technology has enabled the DRAM to be incorporated into large, highly integrated ICs, sometimes called "SOCs" or "systems on a chip". Typical applications for these embedded DRAMs or "e-DRAM" include for use as fast memory adjacent a processor such as cache memory, as fast scratchpad memory, or to reduce the need for or totally replace the discrete DRAM devices in systems where space is at a premium.

In conjunction with the increasing use of DRAMs embedded with various other logic circuitry on a single integrated circuit, process technologies for manufacturing of integrated circuits continue to shrink. As the scaling of the dimensions of CMOS integrated circuitry gets smaller, certain dominant problematic effects become increasingly dominant. The resistance of the fine wires used to fabricate control lines increases, as the amount of metal or conductive polysilicon used to produce the lines decreases along with device size. This increased resistance results in signal distortion in control signals that run for substantial distances across a device, and especially for control signals that see many loads.

The increased processing power and parallelism in modern processors has lead to increased data word width in many designs. While early microprocessors were only four or eight bits wide, current data word widths are 32 or even 64 bits wide. This width drives many functions to be arranged in a wide fashion and in particular leads to wide memory arrays. For a 64 bit wide DRAM, the array may have 64 columns. The data word width therefore tends to push the length of the control signals, which must traverse across all 64 columns to longer lengths.

FIG. 1 depicts a typical prior art memory cell 11. For a dynamic memory cell such as is commonly used, an access transistor ($T_s$) couples a data line (DL), sometimes referred to as a bit line or "BL" in response to control voltage on a gate terminal of the access transistor coupled to the wordline WL, to a storage capacitor ($C_s$) which is coupled between the access transistor and a reference or supply voltage (Vs). The voltage used as the potential for the storage capacitor can be a ground or a positive voltage, depending on the particular design of the DRAM, as is known in the art. The gate of the access transistor $T_s$ is coupled to one of a plurality of lines called word lines (WL), often referred to as row lines or rows. A typical DRAM will have many thousands of the cells 11 depicted. The cells will be arranged in one or more arrays and typically the bit lines or data lines DL will be arranged in a plurality of spaced columns, the word lines or row lines will be arranged in a plurality of rows. The storage capacitor may be fabricated in many ways. Although single transistor memory storage cell is depicted in FIG. 1, many other storage cells are known in the art including two transistor and even static RAM cells with six transistors. In the prior art for DRAM cells, planar capacitors have been used, more recently crown capacitors formed above the access transistors in insulating and metal layers have been used to further increase the density (number of bits per unit of silicon area) of the arrays. Alternate implementations where the capacitors are formed as part of a trench formed into the substrate adjacent the access transistors are known in the art and are likewise used to increase capacity per silicon area. In addition, various processing techniques are known to increase the capacitance of the cells, including as but one example hemispherical grain (HSG) polysilicon material, and other materials. Irrespective of the type of storage cell used, the significant feature is that the memory has an array of storage cells coupled to word lines and data lines by one or more access transistors, The storage capacitor $C_s$ of FIG. 11 may be used to hold a charge representing a logical data value. The voltage stored may be assigned a logical '1' or a logical '0' depending on the design approach used for the particular DRAM. The storage capacitor $C_s$ is written by a control circuit coupling a data value for storage onto the data line DL while the access transistor $T_s$ for the particular cell is simultaneously activated by placing the appropriate voltage on the control gate, that is, the word line WL associated with the cell 11 has a control voltage on it. To read the value, the access transistor is activated while no voltage or a simple bias level is placed on the data line DL and the capacitor discharges through the access transistor to place a stored voltage on the data line. This small voltage is then coupled to a sense amplifier where the level is sensed and amplified to the appropriate voltage representing a logical value; this logic voltage (a data value) is then coupled through I/O circuitry connected to the data line DL to make the read data available for use. To write the cell, a strong voltage is placed on the bit or data line DL and the access transistor is then activated using the access transistor by placing an active voltage on the word line WL. The capacitor is then charged to the proper voltage and when the access transistor is then disabled, the charged capacitor stores the appropriate value until the access transistor allows the capacitor to discharge in a subsequent read operation.

Because the storage capacitor $C_s$ has an inherent leakage current, the storage cell 11 must be periodically refreshed by the control circuitry. The refresh cycle may be controlled by an external processor as is known in the art. More often in current products, an on board controller provided as part of the control circuitry will periodically refresh the storage capacitors (called "self-refresh" or "auto-refresh"). The refresh is a read write-back cycle that reads the stored values from a plurality of cells which require refreshing based on the time that has passed since the last refresh or access cycle, the data is read out, amplified by the sense amplifiers, and written back into the cells. Because the storage cells of a one transistor or 1T cell such as 11 require refreshing to maintain a stored value, the memory implemented using such cells is referred to as "dynamic" memory. Dynamic memory requires more control circuitry than a static memory, such as an SRAM, but the small physical size of the DRAM cell allows many more bits of storage to be implemented per unit of silicon area than is possible for a corresponding SRAM cell. Nonvolatile memory may also be used, such as EEPROM, FLASH, and the like; these memories also require additional control circuitry and the cells are sometimes larger in area than the DRAM cell 11.

FIG. 2 depicts in a plan view a block diagram of a DRAM array of the prior art using memory cells such as the one illustrated in FIG. 1. In DRAM 31, a plurality of memory cell arrays 35 is provided each having a plurality of memory cells 11 inside (not visible in the portion depicted). The memory cells are arranged as columns, with each column being associated with one bit of a data word, the I/O buffers 39 couple the data lines (not shown) which run in a columnar direction, to a data bus. Wordline decoders 33 activate the particular word line associated with a row of the memory cells 11 within the arrays 35 responsive to an address value received from outside. Each array of cells is coupled to a sense amplifier which receives two data lines, usually called bit line or BL and a complementary bit line or BL_. In FIG. 2 a single memory bank is shown so only one pair of bit lines is coupled for each column. Control logic 41 provides the various signals to the sense amplifiers 37 and the I/O buffers 39 to cause the data presented at the I/O ports to be written to the appropriate row of memory cells, or, to cause stored data to be read from the appropriate row of memory cells to output data from the I/O buffers 39. All of these operations and the circuits required are well known in the art.

FIG. 3 depicts a plan view of a block diagram of a further prior art embodiment of a DRAM array which uses segmented bit lines or data lines to share the sense amplifiers between two banks of memory cells. In FIG. 3, DRAM array 51 includes a memory bank 0 which is an upper memory bank and has memory cell arrays 55 that include memory cells as shown in FIG. 1 arranged in rows and columns, each memory array 55 having a pair of bit lines or data lines BL, word line decoders 53 provide the appropriate voltage on the appropriate word line or row lines (not shown) for reading and writing an addressed row of memory cells. Sense amplifiers 57 are shared between the upper memory bank 0 and the lower memory bank 1. A second wordline decoder circuit 53 for bank 1 is depicted in the lower portion of the block diagram and this wordline decoder provides the required word line signals for addressing a row of memory cells in the memory arrays 59 of bank 1. The data lines or bit lines from bank 1 are also selectively coupled to the same sense amplifiers 57 for each column in an architecture known as "segmented" bit lines. Although only two memory banks are illustrated, many more may be provided. A complete DRAM of the prior art may include thousands or even millions of cells in a single device. I/O buffers 61 then provide the output data to a data bus, or input data from a data bus, to couple the DRAM array 51 to circuits outside the array.

In FIG. 2, a distance arrow 42 is shown running horizontally across the sense amplifiers 37 on either side of the control logic 41. This distance arrow illustrates that a control signal from control logic 41 to control each of the sense amplifiers (all of which are typically active for a read or write cycle of a selected row of the DRAM cells) has a length proportional to the number of columns in the array. Further, because each bit of a data word is coupled to a column, the width of a data word used in a DRAM array determines how wide the array becomes and thus, how long these lines must be. Also, the number of bits in the data word determines how many columns there are in the array and thus how many sense amplifiers are coupled to the control line, that is, the width of the data word is proportional to the number of loads on the control line. As the data word width increases, the number of loads on the control line for the sense amplifiers also increases.

The arrangements of DRAM cells shown in FIG. 2 and FIG. 3 may depict the major blocks of a typical DRAM integrated circuit. However increasingly DRAM circuits are being embedded into application specific integrated circuits (ASICs), so called SOCs or "System on a Chip" devices, custom integrated circuits and the like. FIG. 4 depicts, in one typical prior art arrangement, the major blocks of an ASIC IC 1 with an embedded DRAM block A. In addition to the embedded DRAM, IC1 includes I/O buffers, an embedded SRAM block B which may be used as a register file, for example, a microprocessor core which could implement a programmable processor, a digital signal processor (DSP), or other known processors such as a RISC machine and the like. In addition to these core or predetermined functions, a section of user defined logic is shown. In this area a designer may implement functions that optimize the circuit for a specific use, such as for a PDA, digital camera, cellphone, music player, radio, or other application as is known in the art. DRAM blocks embedded with other circuitry in an ASIC or SOC are typically referred to as "e-DRAM."

The use of improved semiconductor processing makes embedding DRAM and other memory blocks more attractive in ASIC or semicustom IC manufacture. Improved isolation and buried layer techniques, coupled with advanced photolithographic techniques, make it possible to provide the smaller transistor sizes and capacitors required for the DRAM block in one portion of an integrated circuit, while processing a different portion of the integrated circuit to produce the larger transistors, and even analog components such as resistors, required for other applications, in a single piece of silicon. These advances make efficient and compact DRAM arrays even more important.

FIG. 5 depicts a schematic of a typical prior art sense amplifier 101 used with an array of memory cells such as the cell shown in FIG. 1. In FIG. 5, a precharge/equalization circuit 103 is depicted. This circuit is controlled by the control signal PRE_ and when active, couples a voltage Vpre (precharge voltage) to a pair of nodes labeled DL_IN and DLB_IN through MOS transistors MP4, MP3. In another mode of operation the precharge circuit acts as an equalization circuit, and couples these two nodes together through a pass gate MP5. In this manner, the voltage placed on the nodes DL_IN and DLB_IN can be equalized or raised to a predetermined pre-charge voltage to speed the sensing of the differential voltage presented to the sense amplifier during a sense operation.

The data lines DL and DLB (data line and data line bar, could also be called bit lines or BL) are coupled to the sense latch 109 by the pass gate transistors PG1 and PG2 in the signal pass blocks 105, 107. In this embodiment, PMOS transistors are used for pass gats PG1, PG2, although it is known in the art to use NMOS transistors or a CMOS pair of transistors for this function. When the sense amplifier is to receive data from the data lines, a control voltage is placed on control inputs PG_U (for 105) or PG_V (for 107) respectively, and the pass gate allows the very small voltage signal sensed from a memory cell coupled to the data line by the control circuit and the word line decoder to appear on the respective sense nodes DL_IN and DLB_IN. The latch formed from the cross coupled inverters of MP1, MN1, and MP2, MN2 then latches the small signal received and amplifies it to a full logic voltage level, which can then be observed by the I/O buffers coupled to the data lines.

The sense latch is only operated when enabled by the transistor MNA which is controlled by the control signal SAE on the gate of MNA. Each sense amplifier depicted in FIGS. 3 and 4 is the same and each one receives the same control signal SAE from the control logic circuitry. The control logic circuitry therefore includes buffers or line drivers that provide this signal to all of the sense amplifiers.

In operation, as is known in the prior art, several steps are taken to sense the voltage stored in the sense amplifier. The differential sensing operation can be made faster by first precharging the two inputs of the differential sense amplifier made of the data latch 109 to a common mid range voltage, such as Vdd/2. Signal PRE_ is used to cause the MOS transistors MP4 and MP3 to be active to pre-charge the nodes DL_IN and DLB_IN to this voltage, which may be less than the positive supply voltage for the array, for example. Transistor MP5 further equalizes the two nodes to be sure the voltage is the same at both inputs to the differential sense amp. After the two nodes DL_IN and DLB_IN are pre charged, one of the two pass gates PG1 and PG2 will be activated, depending on the row and column address of the cell to be read. The selected pass gate will couple the small voltage sensed from the memory cell onto the respective sense node DL_IN or DLB_IN; the other node will remain at its precharged voltage due to parasitic capacitance in the circuit.

Finally the sense amplifier will be enabled by a pulse from the control circuitry on input SAE, which causes the enable transistor MNA to couple the sense amplifier latch 109 to a ground or other voltage supply (this could also be negative, for example) to allow current to flow through transistors MP1 MN1 MP2 MN2. Since one of the inputs DL_IN or DLB_IN will be greater than or less than a threshold potential for one of the transistors, while the other input is at an intermediate value, the latch 109 will latch that input value, Because the sense latch will amplify that input value due to the gain of the transistors in the latch, the small signal voltage sensed will be amplified to a full logic value for output to the I/O buffers. All of these operations and the circuit of FIG. 5 are well known in the art.

FIG. 6 depicts timing voltage diagram of the control pulse placed on control line SAE at the output of the control circuit, labeled "SAE control." FIG. 6 also depicts what the pulse might look at when sampled at a prior art sense amplifier some distance from the control circuit in a second voltage diagram labeled "SAE sense amp." Because the distance of the control line is long, and because there are many enable transistors (MNA in FIG. 5) coupled to the line (one for each sense amplifier in FIGS. 3 or 4), the signal can become distorted. To operate properly, either the driving circuitry in the central control logic circuits of FIG. 3, or 4, must be made quite large, or additional "repeater" circuitry must be provided. In order to keep the storage bit density per silicon area as high as possible, these approaches are typically avoided if at all possible. However, as the memory arrays become increasingly larger, and as the data word width becomes increasingly wide, the signal distortion problem will become worse and will require additional circuitry to correct. If the distortion remains, incorrect operation may occur if one or more sense amps do not in fact become enabled, while others which have less signal distortion are enabled.

Thus this prior art solutions requires added logic circuitry and layout area to address the distortion problem. A need thus exists for an improved sense amplifier circuit that maintains the layout efficiency and compactness of the prior art while offering an efficient solution to the distortion problem on the control lines, while still maintaining proper noise margins and ensuring correct data retention, fast access time, efficient operation and efficient use of silicon area.

SUMMARY OF THE INVENTION

These and other problems are generally solved or circumvented, and technical advantages are generally achieved, by embodiments of the present invention, which provide circuits and methods of forming a sense amplifier for a DRAM for use in an integrated circuit which solves the control signal distortion problem described above by providing a pair of control signals, on lines that are preferably designed to be of very similar length, resistance and area with very similar loads, to carry the signals to a pair of series coupled enable transistors within each sense amplifier circuit. These cascade coupled MOS transistors may be efficiently laid out in approximately the same area, or almost the same area, as the present enable transistor and by selecting the size of these cascade coupled transistors, the performance of the sense amplifier latch may be left unaffected. The use of the two cascade coupled series MOS transistors further allows the distortion in the control signal to be overcome, the SAE signal received by the circuit is determined not by a highly loaded control signal, but instead by a pulse determined by the delay difference in the signals developed within the control circuit. The invention has the beneficial effect that irrespective of whether the sense amplifier is near or far from the control circuit, the same enable signal pulse is developed and the length of the delay between the two control signals will determine the length of the received control pulse, which is not determined by the distance from the control circuit or the number of loads between the control circuit and the sense amplifier. Thus every sense amplifier will receive the same control signal, as required for proper operation.

In one preferred embodiment the sense amplifier is provided in a DRAM circuit. In another preferred embodiment, the sense amplifier is provided in a DRAM circuit embedded with logic circuitry, user specified circuitry and other circuitry in an integrated device.

In another preferred embodiment, the sense amplifier is further improved by providing a logic circuit coupled between the control circuit and one of the enable transistors. In yet another preferred embodiment, the logic circuitry may be an inverter. In other preferred embodiments, control circuitry may be placed between the control signal and both enable transistors.

In additional preferred embodiments, the two control signals may be of the same polarity. In other preferred embodiments, the two control signals may be of different polarity.

In a first preferred circuit embodiment, the cascade transistors are placed between the sense amplifier and ground reference, and are N channel MOS transistors. In another preferred embodiment, the cascade transistors are placed between a positive voltage supply or reference potential and the sense amplifier, and are P channel MOS transistors. In either embodiment the circuit may be simply modified to use the other type of MOS transistors, these arrangements are also preferred embodiments that are contemplated as part of the invention and are within the scope of the appended claims.

In a preferred method, the lay out design of the conductors carrying the two control signals is symmetric. In another preferred method, the lay out design of the conductors carrying the two control signals is such that the conductors are of the same material, and the area of the two control signals is within 5% of each other. In another preferred method, the two control signals are designed and laid out to have the same length and the same cross sectional area to within 5%. In another preferred embodiment, the two conductors are coupled to the same number of transistors such that the loading on the two lines is the same to within 5%. Generally, layout techniques must be used to ensure the two conductor lines are very similar in conductivity and loading so that they are symmetric.

In a preferred method, the first control signal is a negative going pulse, and the second control signal is a positive going pulse that is a delayed version of the first control signal, such that the delay between the transitions in the first and second control signal creates an enable signal with a time period defined by the second edge of the first control signal and the second edge of the second signal. In this manner an enable pulse is created within the sense amplifier that has the same duration in each of the sense amplifiers irrespective of how far the sense amplifier is from the driving transistors of the control lines. In another preferred method, the two control signals have the same polarity and the control signals are coupled to a logic circuit coupled to one of the enable transistors to provide the delay, such that the two signals need not be delayed at the control circuit but the delay is created within the sense amplifier circuit itself. In another embodiment, a single control line is routed across the array, and a logic circuitry is provided adjacent each sense amplifier to create the second pulse, which is a delayed version of the first pulse.

Integrated circuits incorporating the DRAM of the invention may embed the DRAM including the novel sense amplifier with various other functions including processors, additional embedded SRAM blocks, I/O circuitry, clocking circuitry, DAC/ADC converters, and the like, to form large systems on a chip (SOCs) as is known in the art.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 8:
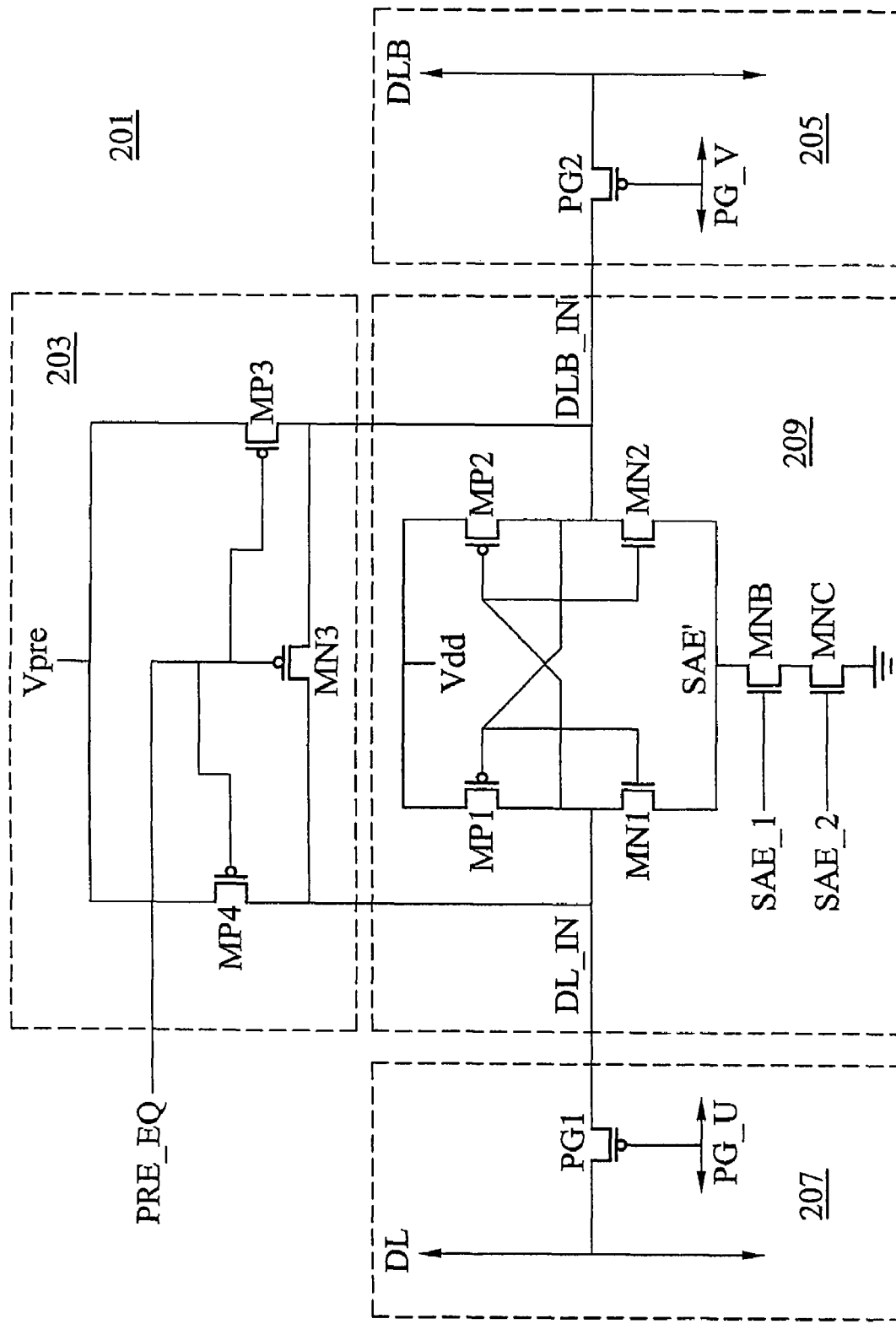
FIG. 8 illustrates a schematic view of a first preferred embodiment of the sense amplifier incorporating the features of the invention.

FIG. 8 depicts in a simple schematic view a preferred circuit embodiment of the sense amplifier 201 incorporating the invention. Pre-charge circuit 203 provides pre-charging and equalization functions to the sense latch 209 responsive to the control signal PRE_EQ input through transistors MP3, MP4 which couple the voltage Vpre to the nodes DL_IN and DLB_IN at the inputs to the differential sense latch 209. Transistor MP5 provides an equalization function by coupling the two nodes together at certain times responsive to the control signal PRE_EQ.

Signal pass block 207 provides an input path from the data line DL to the input node DL_IN of the sense latch 209, responsive to the control signal PG_U on the control gate of pass gate PG1. Signal pass block 205 provides an input path from the complementary data line DLB to the input node DLB_IN of the sense latch 209, responsive to the control voltage PG_V on the control gate of pass gate PG2.

The cross coupled inverters MP1, MN1, and MP2, MN2, provide the differential sensing and latch functions required for the sense amplifier to receive small voltage signals stored in the capacitors of the memory cells and placed on the data lines DL and DLB, and to latch and amplify those signals to full logic levels for use by the input output buffers.

The sense amplifier enable circuit is now provided by transistors MNB and MBC as shown in FIG. 8. Also as shown in FIG. 8, the control lines SAE_1 and SAE_2 are both required to be active to create the required voltage at the control node SAE'. Thus there are now two control lines SAE_1 and SAE_2 for each sense amplifier 209.

Figure 1:
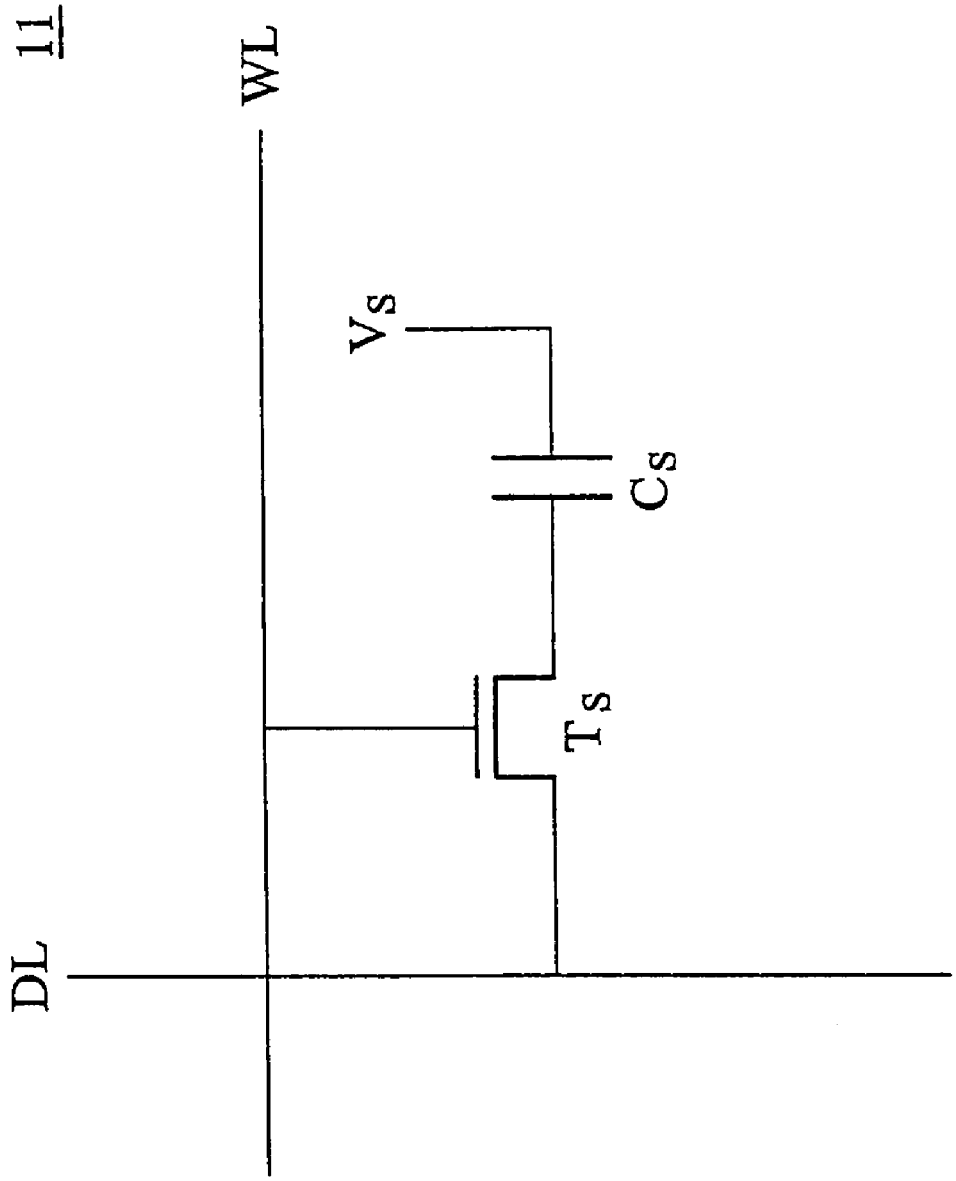
FIG. 1 illustrates a memory cell of the prior art.
Figure 2:
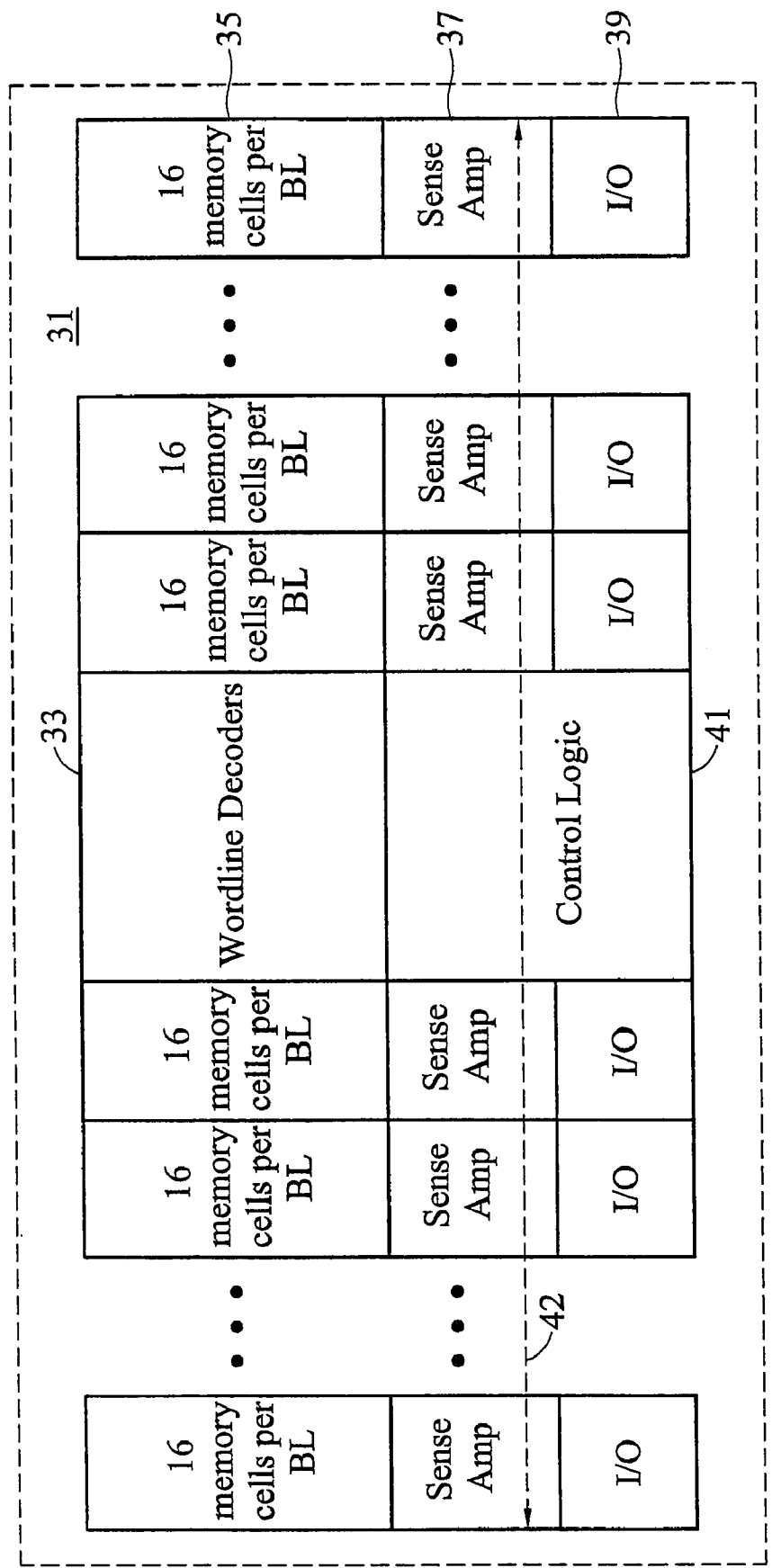
FIG. 2 illustrates a simplified block diagram of a portion of a DRAM cell array of the prior art.
Figure 3:
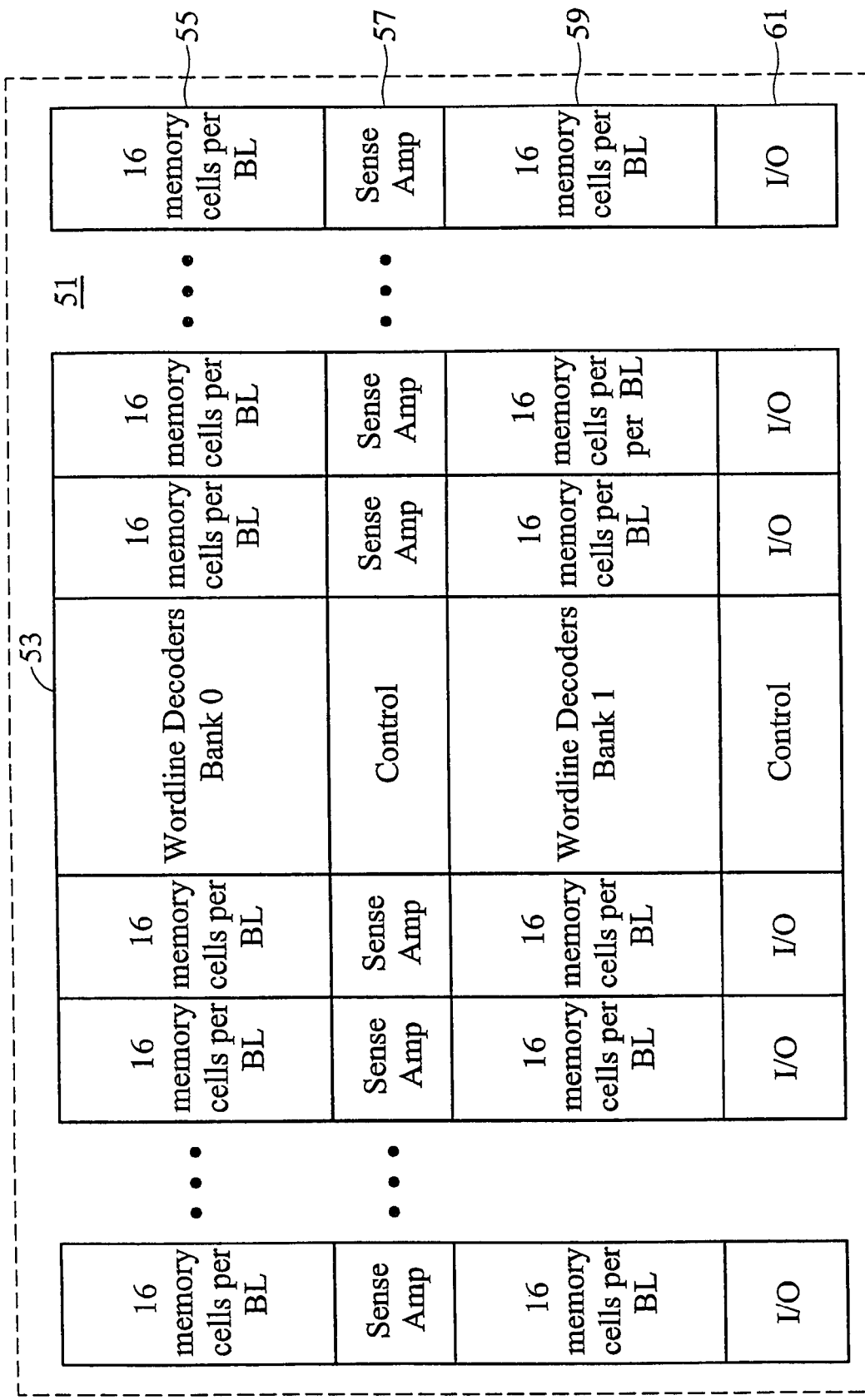
FIG. 3 illustrates in a simplified block diagram a portion of a two bank DRAM cell array of the prior art.
Figure 4:
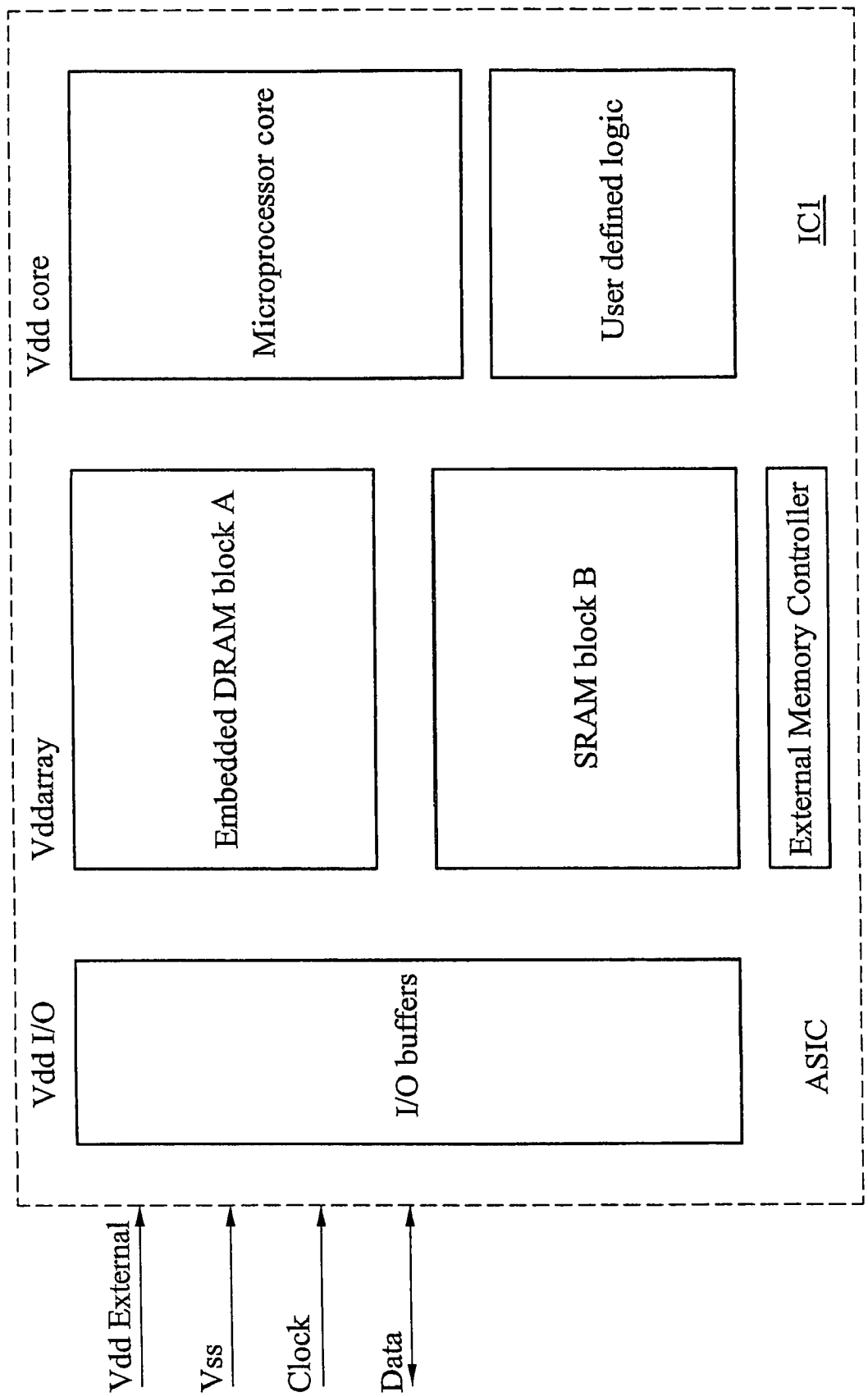
FIG. 4 illustrates in a simple plan view a block diagram of an integrated circuit incorporating a DRAM array with other circuitry.
Figure 5:
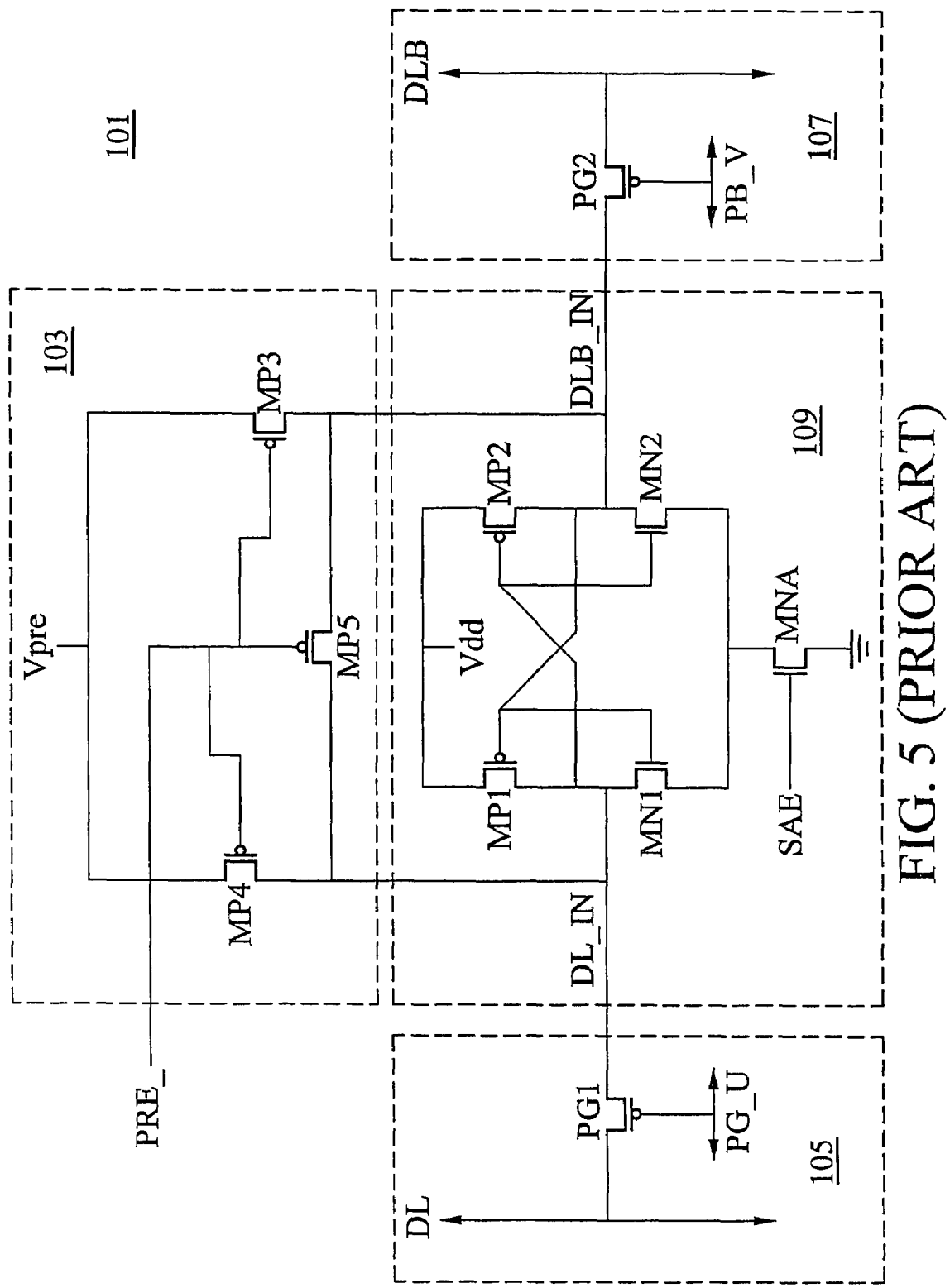
FIG. 5 illustrates a schematic view of a sense amplifier as used in DRAM circuits of the prior art.

In operation, the circuit of FIG. 8 operates in much the same manner as the prior art sense amplifier of FIG. 5 with the additional feature that the enable node SAE' is not coupled to the voltage supply or ground node until both signals SAE_1 and SAE_2 are received. As can be seen from FIG. 8, when the enable transistors MNB and MNC both have the proper control voltage at their gate inputs, the cascade series coupled transistors will couple the supply voltage to the node SAE'.

Figure 6:
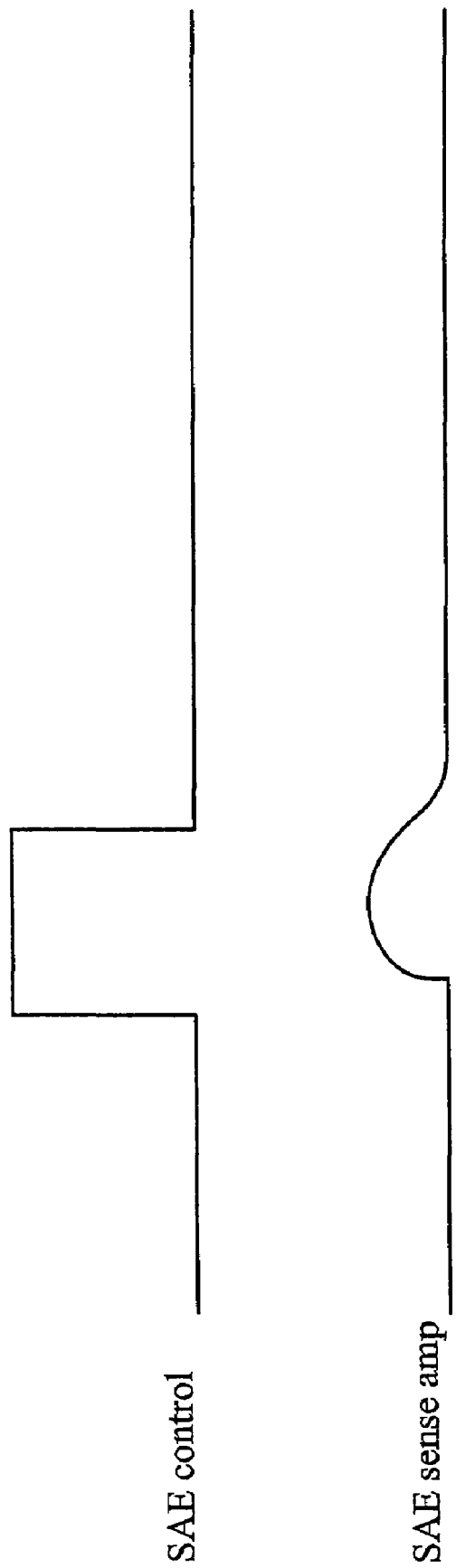
FIG. 6 illustrates the control signal as used in sense amplifiers of the prior art.
Figure 7:
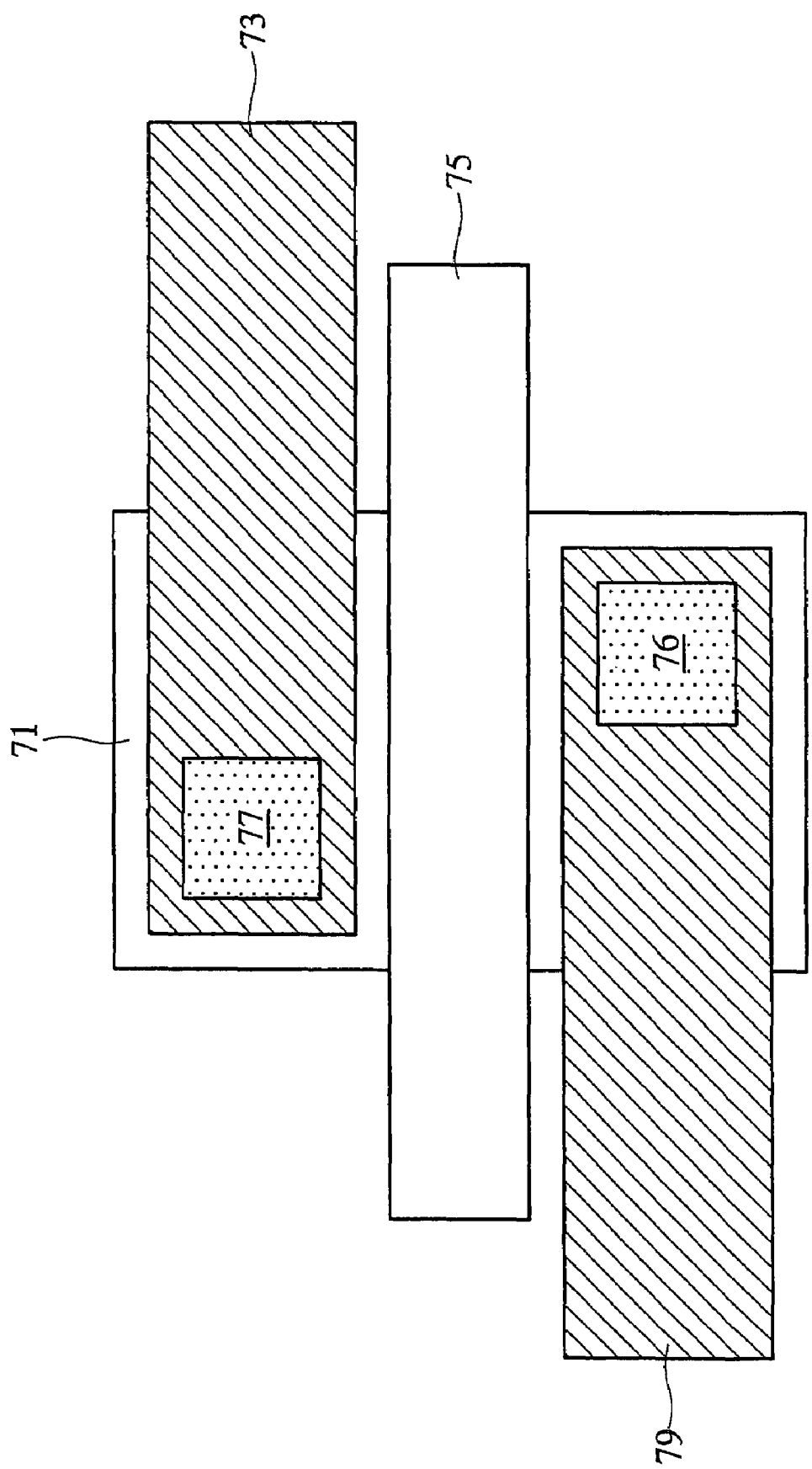
FIG. 7 illustrates a plan view of a layout of a MOS transistor used in the sense amplifiers of the prior art.
Figure 9:
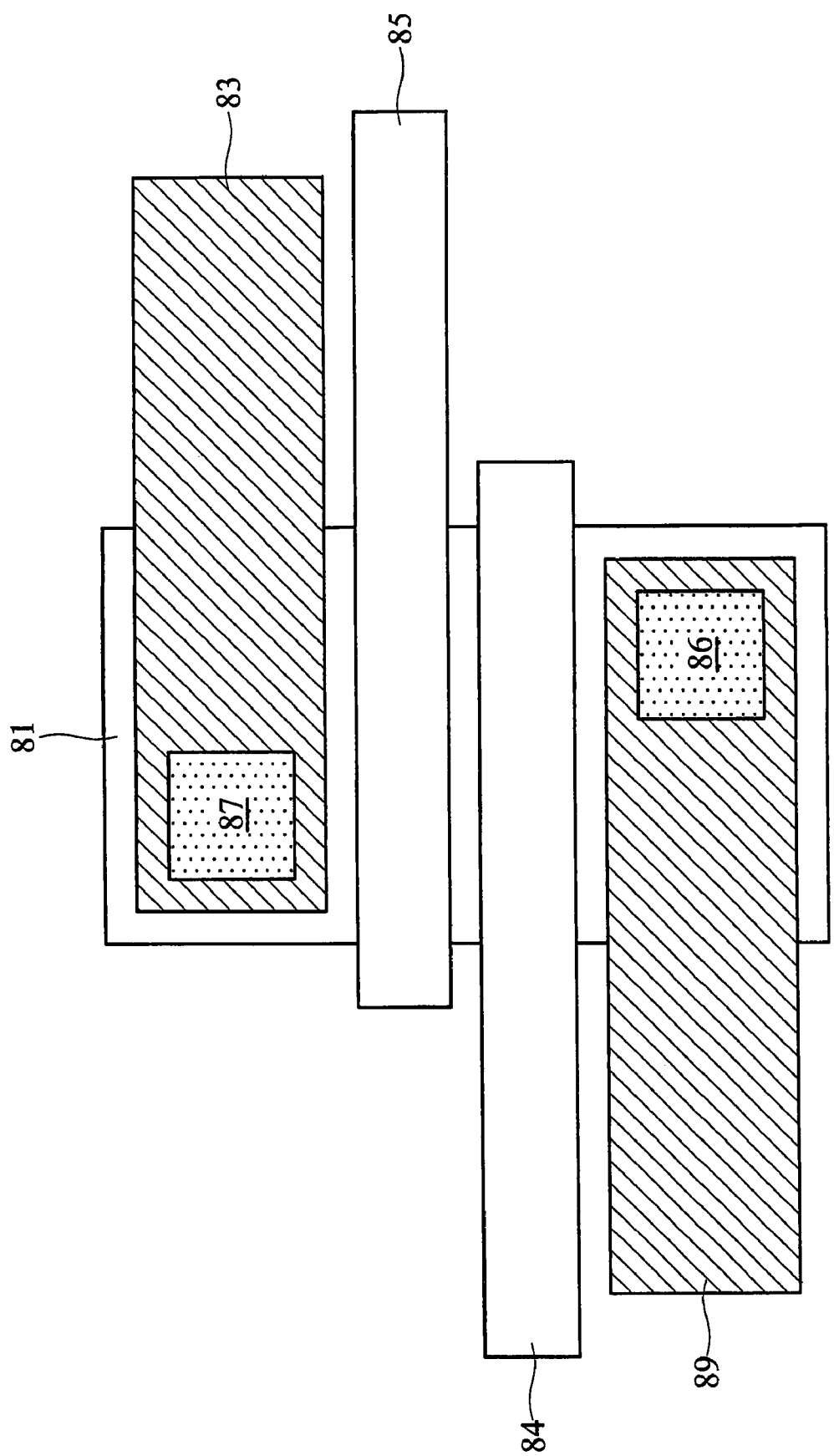
FIG. 9 depicts a plan view of the layout for a cascade MOS transistor pair as used in the circuit schematic of FIG. 8.

As shown in FIG. 8, the transistors MNB and MNC may be implemented as NMOS transistors. Alternatively, these transistors could be implemented as PMOS transistors or as CMOS pairs. In any event, as is known in the art, it is possible to size these transistors and arrange the cascaded pair in approximately the same silicon area as the prior art transistor MNA of FIG. 7. The typical layout for a cascade pair of transistors is depicted in a plan view in FIG. 9, as can be seen by comparing this layout to one for a single MOS transistor as shown in FIG. 6, the common source/drain arrangement of the cascade pair results in a layout area that is almost the same size, so the approach of the invention carries a small area penalty over the approach of the prior art.

There are several advantages to the arrangement of FIG. 8 over the prior art. Because the two transistors MNB MNC can be made of different sizes than the prior art enable transistors, the loading of the signals SAE_1 and SAE_2 can be reduced over the prior art. Further, the position of the sense amplifier on the control line, whether near or far from the control circuit, no longer determines the pulse received as a control signal at node SAE' by the sense amplifier. As illustrated in FIG. 8, the relationship of the signals SAE_1 and SAE_2 now controls the sense amplifier enable pulse time.

Figure 10:
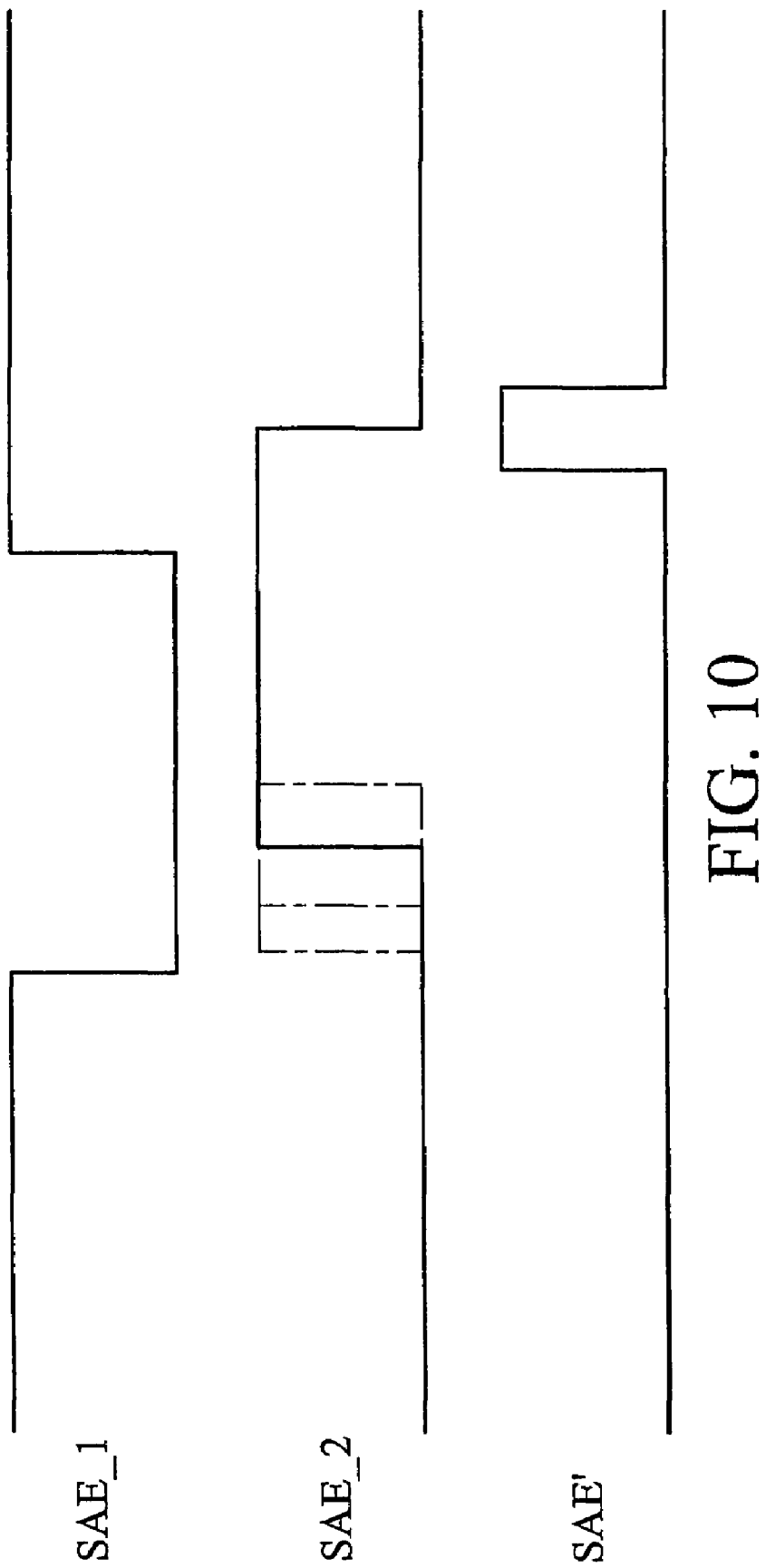
FIG. 10 depicts timing diagrams of the control signals used with the preferred embodiments of FIG. 8 and 9.

In FIG. 10, voltage diagrams illustrate a first preferred method of providing the control signals to the sense amplifier of FIG. 8. Signal SAE_1 is a low going pulse that is first sent from the control circuit as a falling transition. Signal SAE_2 is an inverted high going pulse that is a delayed and inverted version of signal SAE_1 that is received from the control circuit. The voltage diagram SAE' illustrates the period when the path to ground or another supply potential is actually open and the sense latch is enabled. This pulse is determined by the time overlap of the two high signals, which is controlled by the delay in sending the SAE_2 pulse. The pulse width on SAE' will be the same for all of the sense amplifiers on the control lines, irrespective of their physical position; whether near, or far, from the control circuit. In other words, distortion on the control lines SAE_1 and SAE_2 no longer has the effect of changing the operation of the sense amplifiers. All of the sense amplifiers get the proper enable signal in spite of distortion that may occur. The pattern of FIG. 8 is repeated for each sensing cycle.

The layout and area of the two conductors used to form the control lines that carry SAE_1 and SAE_2 are of importance. These two conductors need to be formed in a symmetric manner in the layout process for the DRAM array design so that they have very similar resistance. This means they should have similar overall lengths, and the transistors MNB and MNC should be preferably identically sized for each sense amp so that the number and size of the loads on the two lines will be equalized. The cross sectional area of the conductors should be designed to be approximately the same. Preferably the two lines will run in parallel and will be formed of the same material at the same time in the fabrication process. In one preferred embodiment the control lines may be of polysilicon. In other preferred embodiments they may be of copper and alternatively of aluminum. The two lines may be formed of different materials at various processing levels but nonetheless the two lines should be very similar in resistance. In one preferred embodiment the two lines carrying the signals SAE_1 and SAE_2 should have a total area within 5% of each other. In another preferred embodiment the difference between the two lines in terms of total area should be less than 10%.

Figure 11:
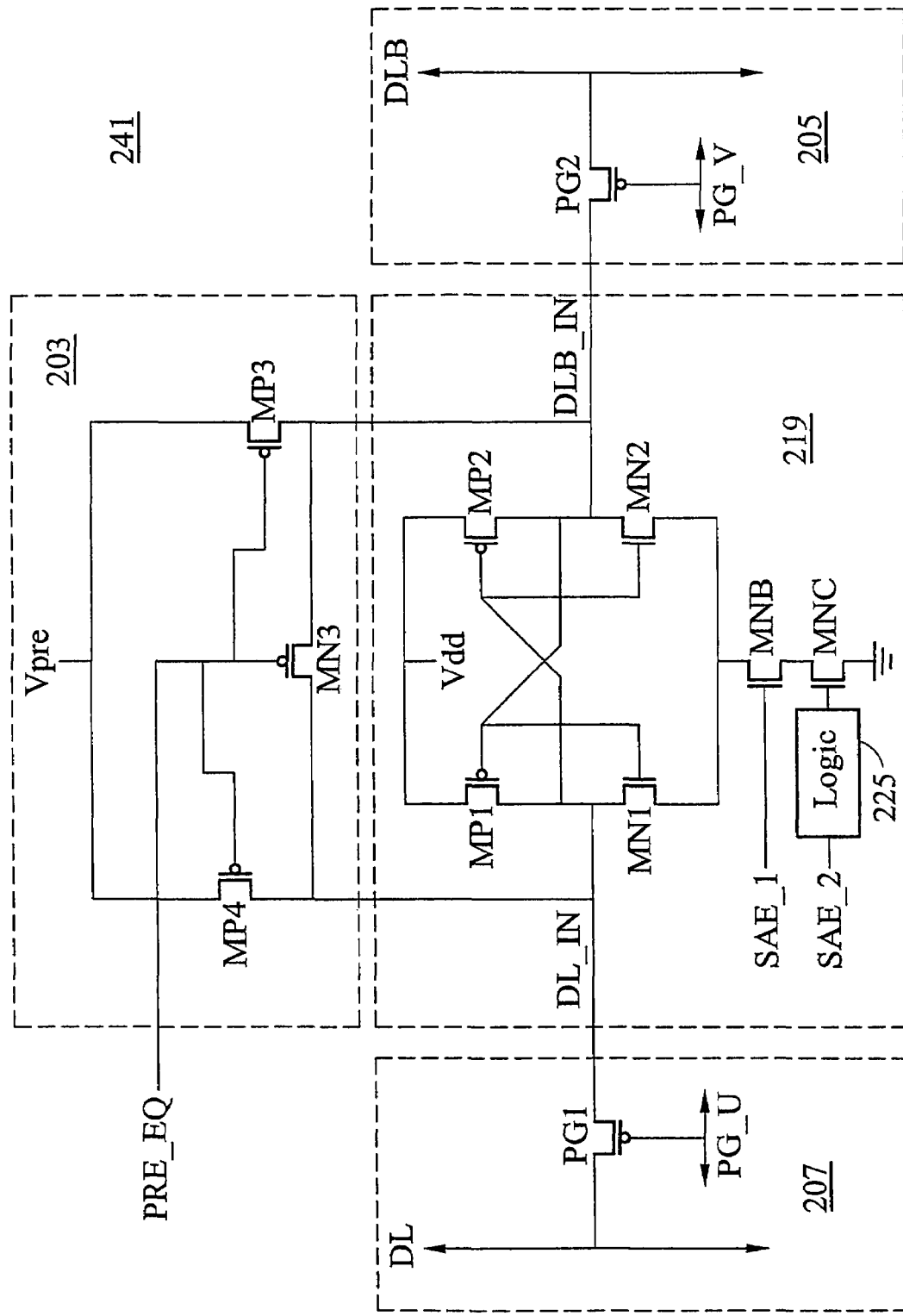
FIG. 11 depicts a schematic view of an alternate preferred embodiment of the sense amplifier of the invention.

FIG. 11 depicts an alternative preferred embodiment of the sense amplifier of the invention. In FIG. 11, a logic block 225 is coupled between the SAE_2 input and the sense amplifier enable transistor MNC. Using this arrangement, it is possible to layout a single control line from the control logic SAE_1. The logic block 225 then provides both the needed delay that determines the period when the sense amplifier is enabled, as shown in the voltage diagram of FIG. 10, and provides the inversion needed to correctly relate signal SAE_2 to signal SAE_1. In yet another preferred embodiment, the layout may still include two control signals from the control circuit, however because the logic block 225 provides the needed inversion of the signal, the polarity of signal SAE_1 and SAE_2 from the control block may be the same. The local logic block 225 will invert the signal SAE_2 to provide the SAE' pulse required within the sense amplifier. 219.

Figure 12:
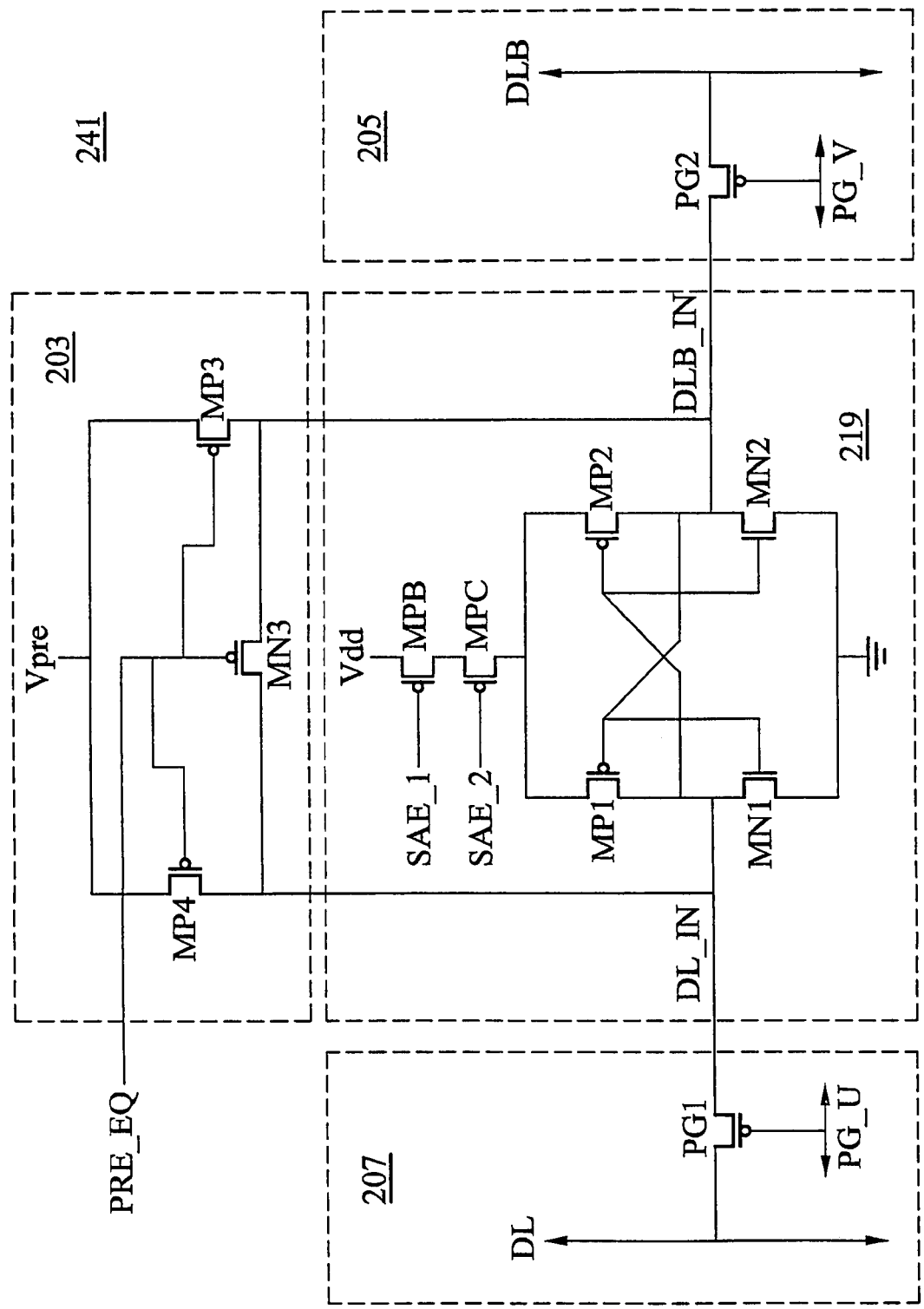
FIG. 12 depicts an additional preferred circuit embodiment of the sense amplifier of the invention.

FIG. 12 depicts another preferred embodiment of the invention. In FIG. 12, the N MOS enable transistors MNB, MNC of the embodiment of FIG. 8 are replaced with a cascaded pair of P MOS transistors MPB, MPC. The operation of the embodiment of FIG. 12 is very similar to the embodiment of FIG. 8, except that the polarity of the signals SAE_1 and SAE_2 needs to be changed so that the pulse is formed at the drain of PMOS transistor MPC, that is, the control signals control the positive voltage supplied to the sense amplifier, and the enable pulse will happen when the signals SAE_1 and SAE_2 are both low and overlapping, instead of both high and overlapping, as before. Again, the overlapping time will determine the length of the enable pulse, and any distortion in the signals due to line length or loading considerations will be overcome by the gain of the cascade transistors MNB and MNC so that each sense amplifier will see the same enable pulse, irrespective of where it is located relative to the driving circuitry in the center of the memory array.

Figure 13:
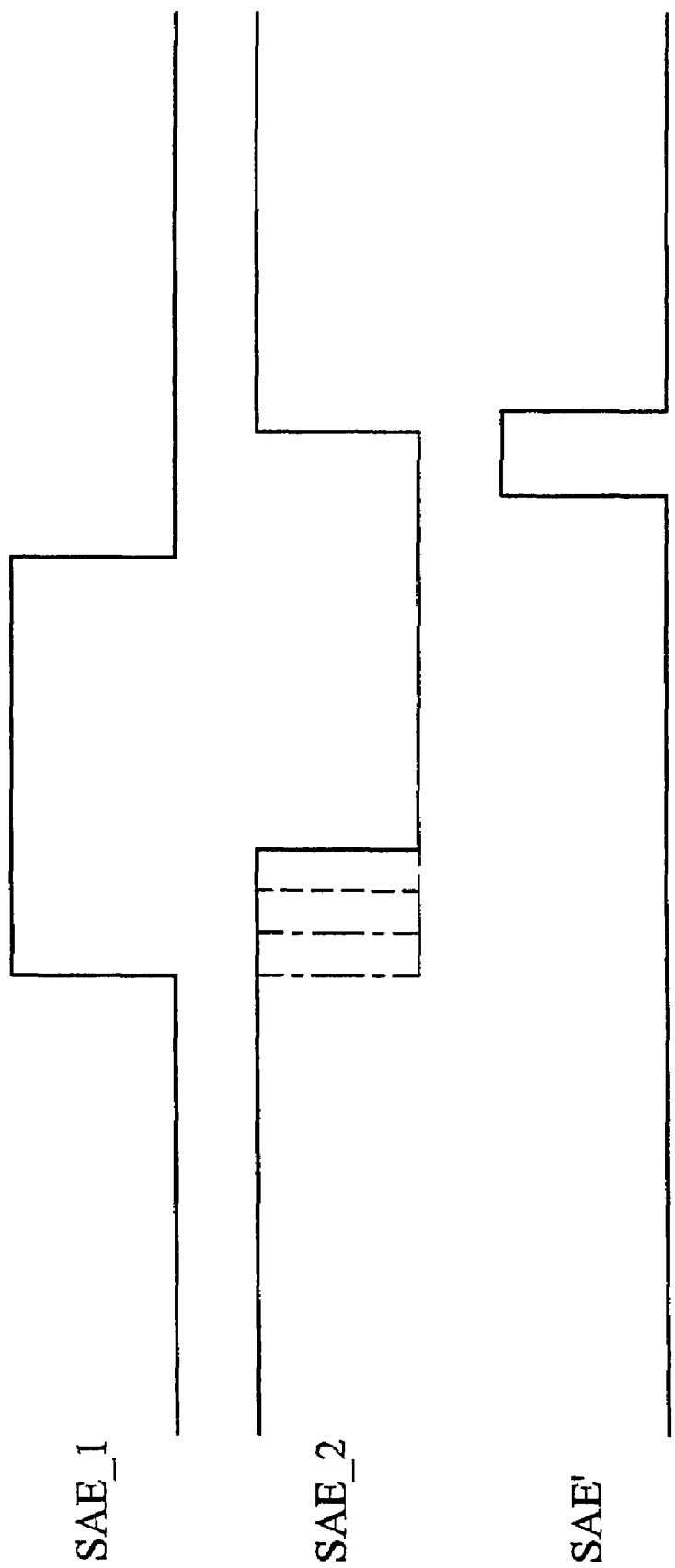
FIG. 13 depicts a timing diagram of the control signals used in conjunction with the control signals of the preferred embodiment of FIG. 12.

FIG. 13 depicts the timing diagrams for the control signals SAE_1, SAE_2 used in the embodiment of FIG. 12. As before, the conductor lines carrying the signals SAE_1 and SAE_2 need to be symmetric and have similar length and total area, and the loading on the lines needs to be similar, that is the transistors MPB and MPC need to be of the same size and the same for each sense amplifier in the array.

The invention thus provides an improved sense amplifier circuit and method which overcomes the distortion problems on the control signals without increasing the layout area or requiring the use of repeaters or large driver circuits in the control circuit.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A sense amplifier circuit, comprising:
a pre-charge circuit coupling a first pre-charge voltage and a pair of differential sense input nodes to pre-charge the differential sense input nodes responsive to a control input;
signal pass block circuits coupled to each of a pair of data lines and to a respective one of the pair of differential sense input nodes, and passing a small signal from the respective data line to the respective differential sense input node responsive to a respective signal pass control input;
a differential sensing latch circuit coupled to a first voltage supply and having an input coupled to each of the differential sense input nodes, and sensing the differential voltage between the differential sense input nodes when enabled at an enable node; and
a sense enable circuit comprising a cascade coupled pair of enable transistors operable to enable the differential sensing latch circuit responsive to a first and a second control input signal, the sense enable circuit coupled to a second supply voltage;
wherein the cascade coupled pair of transistors further comprises a first MOS transistor coupled to the enable node of the differential sensing latch circuit, a second MOS transistor cascade coupled to the first MOS transistor and further coupled to the voltage supply, and the first MOS transistor has an input coupled to the second control input signal.

2. The sense amplifier circuit of claim 1 wherein the first control input signal has a first polarity and the second control input signal has a second opposite polarity.

3. The sense amplifier circuit of claim 1 wherein the second control input signal is delayed with respect to the first control input signal.

4. The sense amplifier circuit of claim 3 wherein the overlap between the first and second control signals determines the enable time period of the differential sensing latch.

5. The sense amplifier of claim 1, wherein the first MOS transistor has an input coupled to the first control signal.

6. The sense amplifier of claim 1, wherein the second MOS transistor has an input coupled to the first control signal.

7. The sense amplifier of claim 1, wherein the second MOS transistor has an input coupled to the second control signal.

8. The sense amplifier of claim 1, wherein the sense enable circuit further comprises a logic circuit coupled to the input of one of the cascade coupled pair of transistors, and coupled to the first control signal for developing the second control signal.

9. The sense amplifier of claim 1, wherein the sense enable circuit further comprises a logic circuit coupled between the second control signal and one of the cascade coupled pair of transistors.

10. A method for a sense amplifier, comprising:
providing a pre-charge circuit coupling a first pre-charge voltage and a pair of differential sense input nodes to pre-charge the differential sense input nodes responsive to a control input;
providing a signal pass block circuits coupled to each of a pair of data lines and to a respective one of the pair of differential sense input nodes, and passing a small signal from the respective data line to the respective differential sense input node responsive to a respective signal pass control input;
providing a differential sensing latch circuit coupled to a first voltage supply and having an input coupled to each of the differential sense input nodes, and sensing the differential voltage between the differential sense input nodes when enabled at an enable node;
providing a sense enable circuit comprising a cascade coupled pair of enable transistors operable to enable the differential sensing latch circuit responsive to a first and a second control input signal, the sense enable circuit coupled to a second supply voltage; and
transmitting the first control signal to a first one of the cascade coupled pair of enable transistors and transmitting the second control signal to the second one of the cascade coupled pair of enable transistors, the second control signal being a version of the first control signal, wherein both of the cascade coupled pair of enable transistors are active during the time period that the first and second control signals overlap and during the time period an enable voltage is present at the enable node;
wherein providing the cascade coupled pair of enable transistors further comprises providing a first MOS transistor coupled to the enable node of the differential sensing latch circuit, a providing second MOS transistor cascade coupled to the first MOS transistor and further coupled to the voltage supply and providing the first MOS transistor further comprises providing an MOS transistor that has an input coupled to the second control signal.

11. The method of claim 10 wherein providing the first control input signal comprises providing a signal that has a first polarity and providing the second control input signal comprises providing a signal of a second opposite polarity.

12. The method of claim 10 wherein providing the second control input signal comprises providing a control signal that is delayed with respect to the first control input signal.

13. The method of claim 12 wherein the overlap between the first and second control signals determines the enable time period of the differential sensing latch.

14. The method of claim 10, wherein providing the first MOS transistor further comprises providing a MOS transistor that has an input coupled to the first control signal.

15. The method of claim 10, wherein providing the second MOS transistor further comprises providing an MOS transistor that has an input coupled to the first control signal.

16. The method of claim 10, wherein providing the second MOS transistor further comprises providing an MOS transistor that has an input coupled to the second control signal.

17. The method of claim 10 wherein providing the sense enable circuit further comprises providing a logic circuit coupled to the input of one of the cascade coupled pair of transistors, and coupled to the first control signal, for developing the second control signal.

18. The method of claim 10 wherein providing the sense enable circuit further comprises providing a logic circuit coupled between the second control signal and one of the cascade coupled pair of transistors.

19. A sense amplifier circuit, comprising:
a pre-charge circuit coupling a first pre-charge voltage and a pair of differential sense input nodes to pre-charge the differential sense input nodes responsive to a control input;
signal pass block circuits coupled to each of a pair of data lines and to a respective one of the pair of differential sense input nodes, and passing a small signal from the respective data line to the respective differential sense input node responsive to a respective signal pass control input;

a differential sensing latch circuit coupled to a first voltage supply and having an input coupled to each of the differential sense input nodes, and sensing the differential voltage between the differential sense input nodes when enabled at an enable node; and a sense enable circuit comprising a cascade coupled pair of enable transistors operable to enable the differential sensing latch circuit responsive to a first and a second control input signal, the sense enable circuit coupled to a second supply voltage;

wherein the cascade coupled pair of transistors further comprises a first MOS transistor coupled to the enable node of the differential sensing latch circuit, a second MOS transistor cascade coupled to the first MOS transistor and further coupled to the voltage supply, and the second MOS transistor has an input coupled to the first control input.

20. A method for a sense amplifier, comprising:

providing a pre-charge circuit coupling a first pre-charge voltage and a pair of differential sense input nodes to pre-charge the differential sense input nodes responsive to a control input;

providing a signal pass block circuit coupled to each of a pair of data lines and to a respective one of the pair of differential sense input nodes, and passing a small signal from the respective data line to the respective differential sense input node responsive to a respective signal pass control input;

providing a differential sensing latch circuit coupled to a first voltage supply and having an input coupled to each of the differential sense input nodes, and sensing the differential voltage between the differential sense input nodes when enabled at an enable node;

providing a sense enable circuit comprising a cascade coupled pair of enable transistors operable to enable the differential sensing latch circuit responsive to a first and a second control input signal, the sense enable circuit coupled to a second supply voltage; and transmitting the first control signal to a first one of the cascade coupled pair of enable transistors and transmitting the second control signal to the second one of the cascade coupled pair of enable transistors, the second control signal being a version of the first control signal, wherein both of the cascade coupled pair of enable transistors are active during the time period that the first and second control signals overlap and during the time period an enable voltage is present at the enable node;

wherein providing the cascade coupled pair of enable transistors further comprises providing a first MOS transistor coupled to the enable node of the differential sensing latch circuit, providing a second MOS transistor cascade coupled to the first MOS transistor and further coupled to the voltage supply and providing the second MOS transistor further comprises providing a MOS transistor that baa a input coupled to the first control signal.

\* \* \* \* \*